United States Patent [19]

Henkles, Walter H. et al.

[11] Patent Number: 5,363,327
[45] Date of Patent: Nov. 8, 1994

[54] BURIED-SIDEWALL-STRAP TWO TRANSISTOR ONE CAPACITOR TRENCH CELL

[75] Inventors: Henkles, Walter H., Putnam Valley; Wei Hwang, Armonk, both of N.Y.

[73] Assignee: International Business Machines Corporation, Armonk, N.Y.

[21] Appl. No.: 6,087

[22] Filed: Jan. 19, 1993

[51] Int. Cl.$^5$ .............................................. G11C 13/00
[52] U.S. Cl. .................................... 365/149; 365/182; 257/301
[58] Field of Search ............ 365/51, 149, 182, 189.01, 365/230.01; 257/301

[56] References Cited

U.S. PATENT DOCUMENTS

| | | |
|---|---|---|
| 4,103,342 | 7/1978 | Miersch et al. |
| 4,792,834 | 12/1988 | Uchida |
| 4,801,989 | 1/1989 | Taguchi |
| 4,816,884 | 3/1989 | Hwang et al. |
| 4,833,094 | 5/1989 | Kenney |
| 4,978,634 | 12/1990 | Shen et al. |
| 5,006,910 | 4/1991 | Taguchi |
| 5,041,887 | 8/1991 | Kumagai et al. |
| 5,089,868 | 2/1992 | Motonami |
| 5,107,459 | 4/1992 | Chu et al. |

FOREIGN PATENT DOCUMENTS

| | | |
|---|---|---|
| 0503199 | 9/1992 | European Pat. Off. |
| 0514679 | 11/1992 | European Pat. Off. |
| 63-232458 | 9/1988 | Japan |

OTHER PUBLICATIONS

Patent Abstracts of Japan, vol. 15, No. 453 (E-1134) Nov. 18, 1991 & JP 3-191567, Aug. 21, 1991.
Patent Abstracts of Japan, vol. 15, No. 209 (E-107) May 28, 1991 & JP 3-057270, Mar. 12, 1991.
IBM Technical Disclosure Bulletin, vol. 31, No. 7, Dec. 1988, High Density Memory Cell Structure with Two Access Transistors.
Patent Abstracts of Japan, vol. 13, No. 483 (E839) (3831) Nov. 1989 & JP 1-192164, Aug. 2, 1989.
Patent Abstracts of Japan, vol. 11, No. 41, (E-478) (2488), Feb. 6, 1987 & JP 61-207058, Sep. 13, 1986.
Patent Abstracts of Japan, vol. 16, No. 97 (E-1176), Mar. 10, 1992 & JP 3-276758, Dec. 6, 1991.
Patent Abstracts of Japan, vol. 13, No. 329 (P-904), Jul. 25, 1989 & JP 1-092994, Apr. 12, 1989.
V. L. Rideout and D. P. Spampinato, "Twin Cell Layout for High Speed Random-Access Memory", *IBM Technical Disclosure Bulletin*, vol. 20, No. 7, Dec. 1977.
S. H. Dhong, H. Hwang and N. C. C. Lu, "High Density Memory Cell Structure with Two Access Transistors", *IBM Technical Disclosure Bulletin*, vol. 31, No. 7, Dec. 1988.
T. Kubota, T. Ishijima, et al., "A New Soft-Error Immune Dram Cell with a Transistor on a Lateral Epitaxial Silicon Layer (Tole Cell)", *Int. Elec. Devices Meeting Technical Digest*, 1987, pp. 344-347.
K. Tsukamoto, M. Shimizu, et al., "Double Stacked Capacitor with Self-Aligned Poly Source/Drain Transistor (DSP) Cell for Megabit Dram", *Int. Elec. Devices Meeting Technical Digest*, 1987, pp. 328-331.

(List continued on next page.)

*Primary Examiner*—Terrell W. Fears
*Attorney, Agent, or Firm*—Scully, Scott, Murphy & Presser

[57] ABSTRACT

A two transistor one capacitor DRAM cell configured with respect to a bit line pair and a single word line in which the gates of the two transistors are connected to the single word line and one of the source/drains of each transistor is connected to a respective electrode of the capacitor and the other of the source/drains of the transistors is connected to a respective bit line of a complementary bit line pair. The storage capacitor is a three dimensional structure with both electrodes being electrically well isolated from electrodes of all other cell storage capacitors. A stacked in trench cell fabrication design is disclosed having a buried strap for connecting the outer electrode to a diffusion region of one transistor and a surface strap for connecting the inner electrode to a diffusion region of the second access transistor.

19 Claims, 11 Drawing Sheets

OTHER PUBLICATIONS

F. Horiguchi, et al., "Process Technologies for High Density, High Speed 16 Megabit Dynamic Ram", *Int. Elec. Devices Meeting Technical Digest*, 1987, pp. 324–327.

Yoshiji Ohta, et al., "A Novel Memory Cell Architecture for High-Density DRAMs", Symposium of VLSI Circuits Digest of Technical Papers, 1989, pp. 101–102.

Shigemi Yoshioka, et al., Session I: Megabit DRAMs, ISSCC 87, Wednesday, Feb. 25, 1987.

1988 Symposium on VLSI Technology, Digest of Technical Papers, May, 1988, San Diego.

M. Arienzo, et al., "Trench Planarization and Simultaneous Formation of Buried Contact for High-Density Dram Cells", *IBM Technical Disclosure Bulletin, vol. 32, No. 5B, Oct. 1989.*

BURIED-SIDEWALL-STRAP TWO TRANSISTOR ONE CAPACITOR TRENCH CELL

FIELD OF THE INVENTION

This invention is directed to dynamic random access memory (DRAM) structures and more particularly to two transistor, one capacitor cells utilizing three-dimensional trench capacitor technology.

BACKGROUND OF THE INVENTION

In semiconductor memory technology, DRAMs experienced rapid growth after the development of the one transistor memory cell structure by Dennard as disclosed in U.S. Pat. No. 3,387,286. The one transistor memory cell uses a capacitor for storing different amounts of charge to represent the distinguishable binary logic states. The early basic one transistor one capacitor memory cell structure utilized a planar access transistor and a planar capacitor in a nearly two dimensional structure. Of the various types of semiconductor memories, DRAMs have been the most widely produced because of their high density, low cost and fast performance.

The major driving force in DRAM design has always been density. It is recognized that the cell density of DRAM chips has approximately quadrupled for each new generation but that the chip area has increased only about 1.5 times per generation. As cells have shrunk in size over the years, various problems have arisen that needed to be dealt with. The following equation summarizes the basic signal level of the one-transistor one-capacitor cell:

$$\Delta V = \left(\frac{C_S}{C_S + C_B}\right)(V_S - V_{REF}) = \left(\frac{C_S}{C_S + C_B}\right)\left(\frac{V_H - V_L}{2}\right) \quad (1)$$

where $\Delta V$ is the differential sense signal, $C_S$ is the storage capacitance, $C_B$ is the parasitic bit line capacitance, $V_S$ is the storage node voltage, which is set to either the high-state, $V_H$, or the low-state, $V_L$, and $V_{REF}$ is the dummy (or reference) cell voltage. The second equality in the above equation, Eq. (1), holds when the reference voltage is set at its optimum value midway between $V_H$ and $V_L$, i.e. $V_{REF}=(V_H+V_L)/2$. As technology and design changes have increased the density of memory cells, consequent changes in one or more of the parameters in Eq. (1) have occurred, adversely affecting the performance of the cells.

For example, as cell sizes get smaller, the bit lines get closer together and the mutual capacitance between bit lines grows. Increased coupling between bit lines means that each bit line is increasingly affected by tile operation of its neighboring lines. Eventually a point is reached at which cell data cannot be read reliably because of that interference- One of the major challenges facing designers of DRAM chips is the problem of getting sufficient cell capacitance into the available cell area. A major effort has developed to fabricate three dimensional capacitor structures to solve this problem. Various-three dimensional designs have been studied such as, the stacked capacitor cell, the trench capacitor cell, substrate-plate trench capacitor cell, and the stacked in trench capacitor cell, some of which are shown in the following U.S. Patents: U.S. Pat. Nos. 5,089,868; 5,041,887; 4,978,364 and 4,833,094. While the three dimensional technology has enabled further reductions in cell size and hence increases in density, the problem of maintaining a sufficiently large storage capacitance, $C_S$, obviously gets worse with each new generation, as technology scales down further. Furthermore, accompanying reductions in power supply voltage are necessary in order to maintain or improve reliability, and to reduce power. But reduction of supply voltage implies reduction of $V_H-V_L$ in Eq. (1) thereby further diminishing already-small signal levels.

Dhong et al. in IBM TDB, Vol. 31, No. 7, Dec. 1988 disclose the incorporation of three dimensional capacitor technology in a cell design that increases signal strength. The cell is a two transistor one capacitor cell structure that utilizes a deep substrate plate trench storage capacitor in which one transistor is connected by a surface contact to the inner electrode of the capacitor and the other transistor is connected directly to the diffusion region formed in the substrate around the trench, which forms the outer electrode of the capacitor. The gates of each of the transistors are connected to a complementary pair of word lines and the drains of each transistor are connected to a complementary pair of bit lines. While the two transistor one capacitor cell of Dhong et al. is claimed to provide twice as large a sense signal than does a conventional one transistor cell using the same capacitor size, and also has the advantage of elimination of the need of a dummy cell, the density is adversely effected because of the utilization be- two word lines for each cell. In addition, isolation between capacitors on the chip is provided by a pn junction in the substrate which, because of leakage, also compromises density since the cell capacitors cannot, therefore, be packed too closely.

An early version of a two transistor one capacitor cell is disclosed in Rideout et al. in IBM TDB, Vol. 20, No. 7, Dec. 1977 in which the source nodes of the transistors are connected to the electrodes of the storage capacitor while each of the drains are connected to a different bit line. Both of the gates of the transistors are connected to a single word line. The circuit, however, was very difficult to fabricate because of layout difficulties. In addition, because the design was planar, the added space needed for each cell was unacceptable.

With the emphasis in DRAM design always being on increasing density, the sense signals appearing on the bit lines inherently decreases. Measures must therefore be employed to ensure that the size of the sense signal will be adequate. Thus, there is a need to design a DRAM cell structure that would provide for adequate signal level while also allowing for high density.

SUMMARY OF THE INVENTION

The present invention is directed to a two transistor one capacitor DRAM cell structure that consists of a storage capacitor accessed by two transistors controlled by a common word line. The two electrodes of the storage capacitor are connected to a complementary pair of bit lines. In addition, the storage capacitor is a three dimensional structure in which both electrodes are electrically well isolated from the electrodes of all other storage capacitors by use of insulators. The DRAM cell structure of the present invention provides significant packing density while also providing an approximate four times increase in sense signal over that of a one transistor one capacitor DRAM cell. The four time increase in signal size is compromised only by a modest approximate 30 percent increase in cell area over that of the one transistor one capacitor cell structures, which is much better than the packing density of prior art two transistor cells.

In a preferred embodiment the DRAM cell structure of the present invention is implemented in a multiplexed array having plurality of bit line pairs in which each bit line can be selectively paired with the two bit lines immediately adjacent thereto. In other words there are DRAM cells connected between bit lines 1 and 2, 2 and 3, 3 and 4, etc. A switching network can select the pairs that will be read into the corresponding sense amplifiers so that, for example, the differential signal between pairs 1 and 2, 3 and 4, 5 and 6 etc. can be selected or the signal between pairs 2 and 3, 4 and 5, 6 and 7 etc. can be selected.

In addition, a preferred method of fabrication utilizes a stacked in trench cell structure. A key provision is a means for providing a buried strap which connects a transistor diffusion with the outer electrode of the capacitor.

DETAILED DESCRIPTION OF THE INVENTION

The present invention is directed to a DRAM cell structure and a DRAM device utilizing said cell structure. The DRAM cell structure of the present invention is a two transistor one capacitor cell implemented using three dimensional capacitor fabrication technology. In the three dimensional cell fabrication employed in the present invention, the capacitor electrodes are well isolated by insulating layers thereby allowing a high packing density. Thus, the space penalty from having two access transistors is compensated by being able to place the cells much closer to each other.

Figure 1:
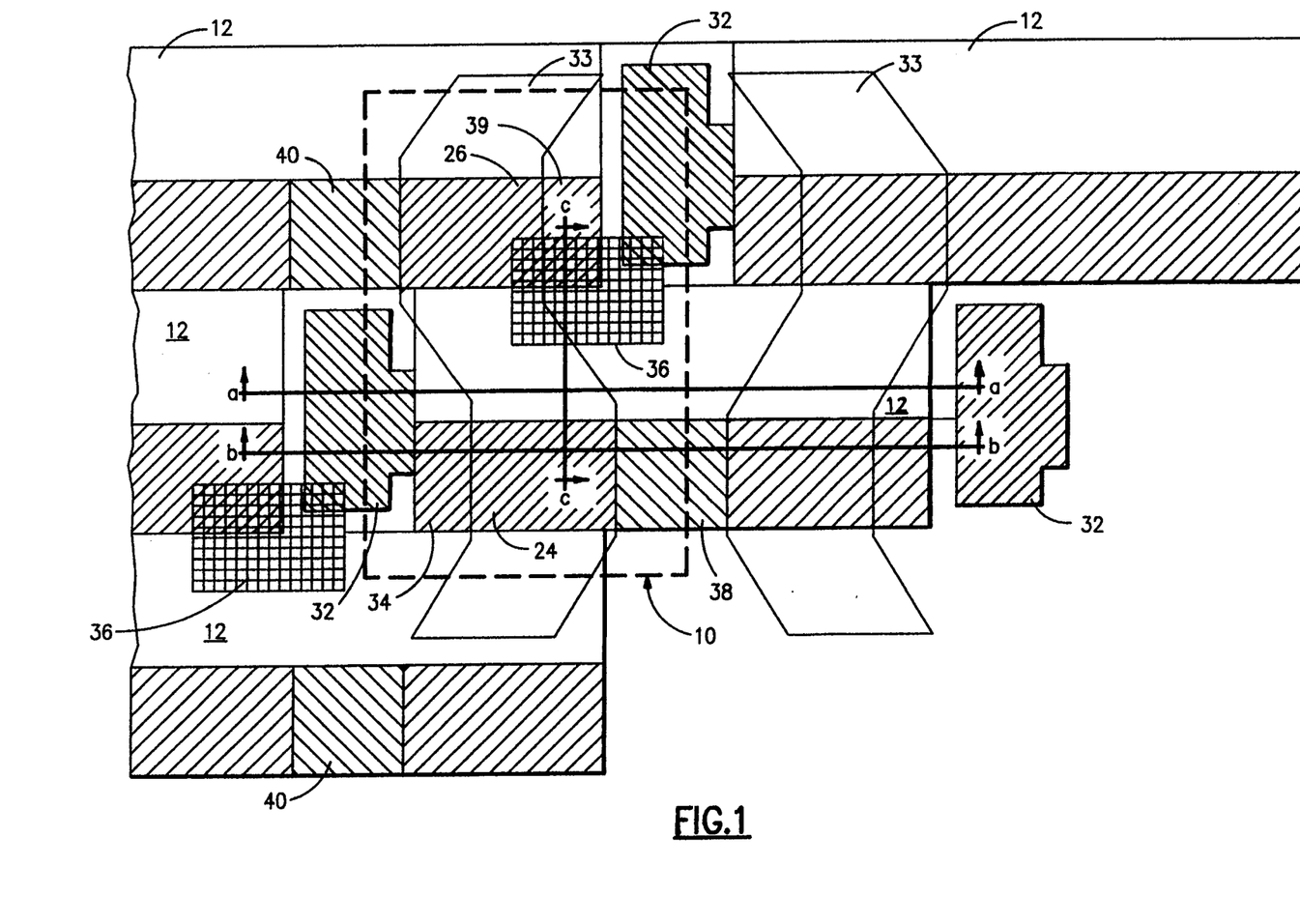
FIG. 1 is a layout view of one embodiment of the DRAM cell structure of the present invention.
Figure 2A:
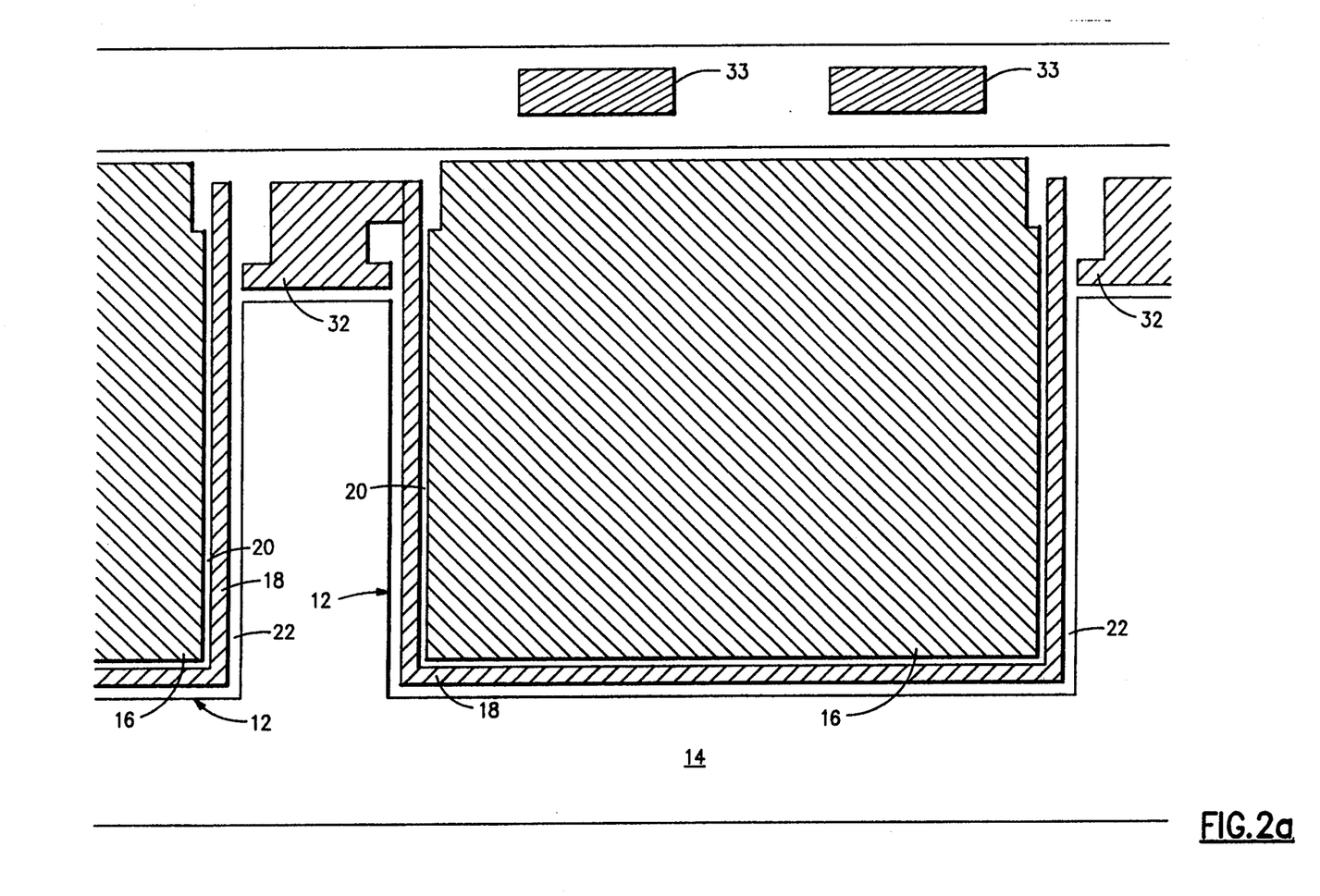
FIGS. 2(a)-2(c) are cross-sectional views of the DRAM structure shown in FIG. 1.
Figure 2B:
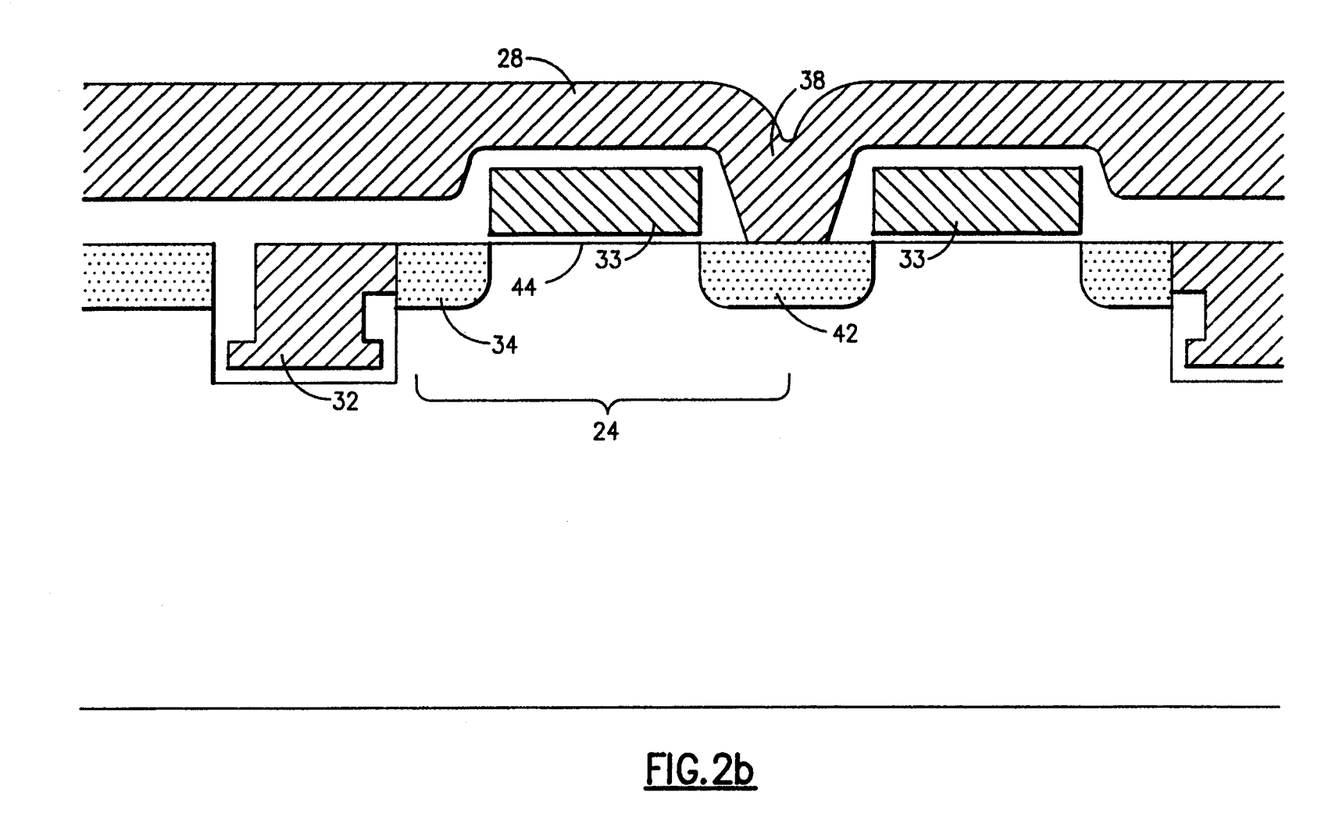
Figure 2C:
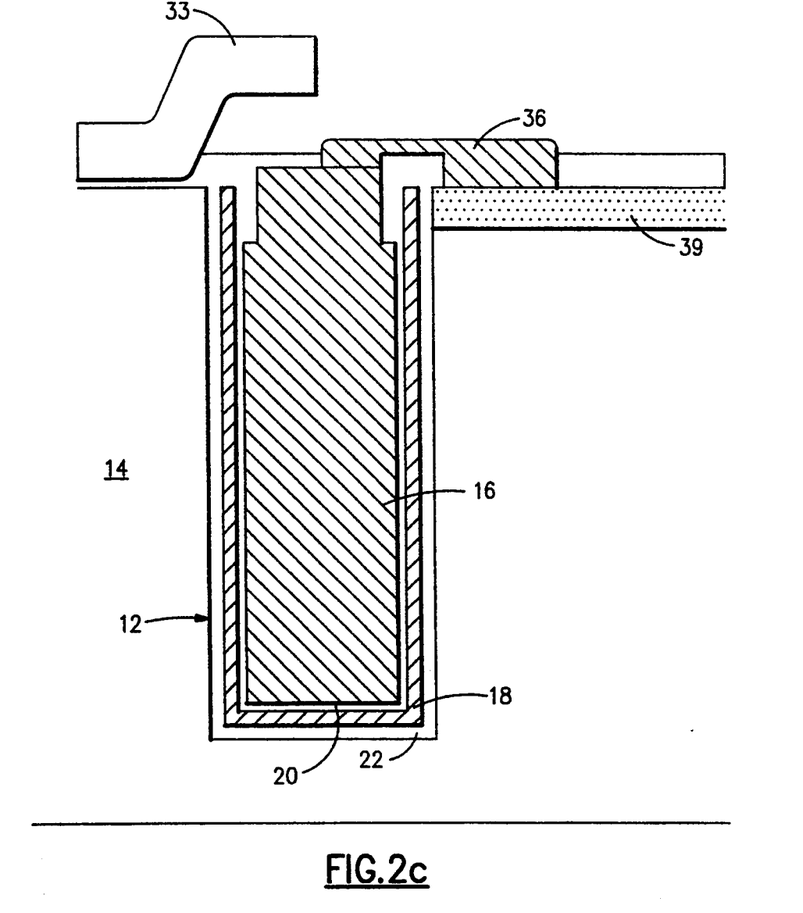

Referring now to the drawings, FIG. 1 is a plan view and FIGS. 2(a), (b) and (c) are cross-sectional views taken along lines aa, bb and cc, respectively, of the two transistor one capacitor cell structure of the present invention. The cell is shown as part of an array of cell structures forming a DRAM memory chip. In FIG. 1, the memory cell 10 is shown contained in the dashed lines. The cell 10 includes trench capacitor 12 formed in semiconductor substrate 14. The capacitor 12 is comprised of an inner electrode 16 of conductive material and an outer electrode 18 of conductive material. A thin layer of insulating material 20 separates electrodes 16 and 18 and a thick layer of insulating material 22 insulates the capacitor 12 from the substrate 14 and adjacent the capacitors on the memory chip. The capacitor 12 shown in FIGS. 1 and 2 is a stacked in trench capacitor and is the preferred embodiment for implementing the DRAM cell structure of the present invention. However, other three dimensional capacitor structures may also be utilized provided that good isolation can be obtained between capacitors. For example, silicon-on-insulator fabrication technology is also considered to be within the scope of the present invention as well as other technologies that would provide the necessary isolation in a three dimensional design.

Figure 3:
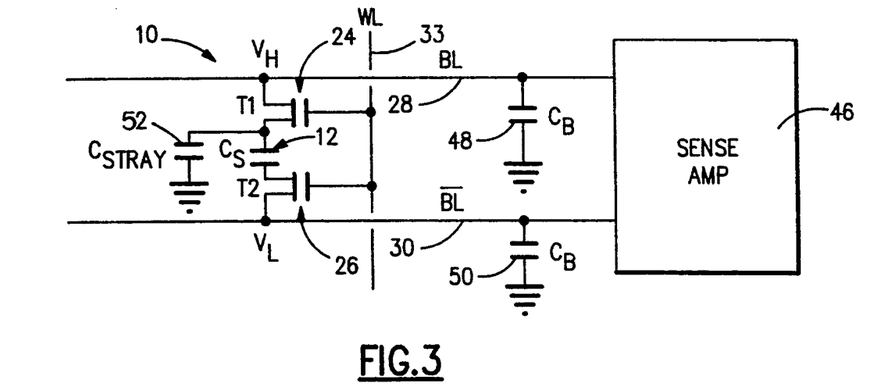
FIG. 3 is a circuit diagram of a DRAM cell structure of the present invention as connected to a sense amplifier on a memory chip.

The trench capacitor 12 has one electrode connected to one of the access transistors and the other electrode connected to the second access transistor. FIG. 3 shows an equivalent circuit of the two transistor one capacitor cell structure 10 of the present invention. As shown, one electrode of capacitor 12 is connected to a first transistor 24 and a second electrode of the capacitor 12 is connected to a second transistor 26. Transistors 24 and 26 are also connected to a complementary pair of bit lines 28 and 30, respectively. It will be understood by those skilled in the art that the sources of transistors 24 and 26 can be connected to capacitor 12 and the drains connected to the bit lines or, the drains may be connected to the capacitor and the sources connected to the bit lines. The gates of both transistors 24 and 26 are connected to a single word line 33.

In the implementation of the cell structure of the present invention shown in FIGS. 1 and 2, a buried strap 32 of conductive material is formed to connect the outer electrode 18 of capacitor 12 to a source/drain region of one of transistors 24, 26. The contact between the buried strap 32 and outer electrode 18 is best seen in FIG. 2(a) while the contact between the buried strap 32 and a source/drain diffusion region 34 of one of the transistors 24, 26 is best seen in FIG. 2(b). The connection of the inner electrode 16 to a diffusion region of the other of the transistors 24, 26 is made by a surface strap 36. The connection of the surface strap 36 between inner electrode 16 and diffusion region 39 is best seen in FIG. 2(c).

Also shown in FIG. 1 is word line 33 that forms the gates of transistors 24 and 26. The bit lines 28 and 30 are not shown in FIG. 1 to simplify the drawing however, the bit line contacts 38 and 40 that connect the bit lines to the respective diffusion regions of transistors 24 and 26 are shown. It should be understood that FIG. 1 is a portion of an array of DRAM cell structures of the present invention and, therefore, also shows the entirety or part of three trench capacitors 12, three buried straps 32, two surface straps 36, two bit line contacts 40 and two word lines 33. In FIG. 2(a), taken along lines a—a, the location of the word lines 33 above the trench capacitor 12 is shown. FIG. 2(b) shows transistor 24 having source and drain diffusion regions 34 and 42 and channel region 44. Bit line 28 is also shown in FIG. 2(b) as well as bit line contact 38 connecting bit line 28 and diffusion region 42 of transistor 24.

Referring again to the equivalent circuit of FIG. 3, the cell structure 10 is shown as it would be connected to a complementary pair of bit lines 28 and 30 and the bit lines connected to a sense amplifier 46. Parasitic bit line capacitances 48 and 50 are also shown. Additional stray capacitance 52 is also shown which is present because of the inherent capacitance between the outer electrode 16 and the substrate 14; see FIG. 2(a). The stray capacitor can be enhanced by reducing the thickness of the insulator 22. Over a wide practical range, the differential voltage $\Delta V$ for the equivalent circuit in FIG. 3 is well-approximated as follows:

$$\Delta V = \left[ \left( \frac{2C_S + C_{STRAY}}{2C_S + C_{STRAY} + C_B} \right) + \left( \frac{2C_S}{2C_S + C_B} \right) \right] . \quad (2)$$

$$\left( \frac{V_H - V_L}{2} \right)$$

As can be seen when comparing the transfer ratio factor with the transfer ratio factor of the sense signal for a one transistor cell structure (equation 1), the transfer ratio of the present invention is approximately twice as large. In addition, in the two transistor differential sensing structure, there is no need for a dummy reference line for reading. The complement bit line always senses the exact complement data, not a mid-point reference voltage; this results in another factor of two. These two factors lead to an approximate 4 to 5 times increase, when the stray capacitance ($C_{STRAY}$) is included, in the sense signal value over that obtained with a single transistor structure of the prior art.

Figure 4:
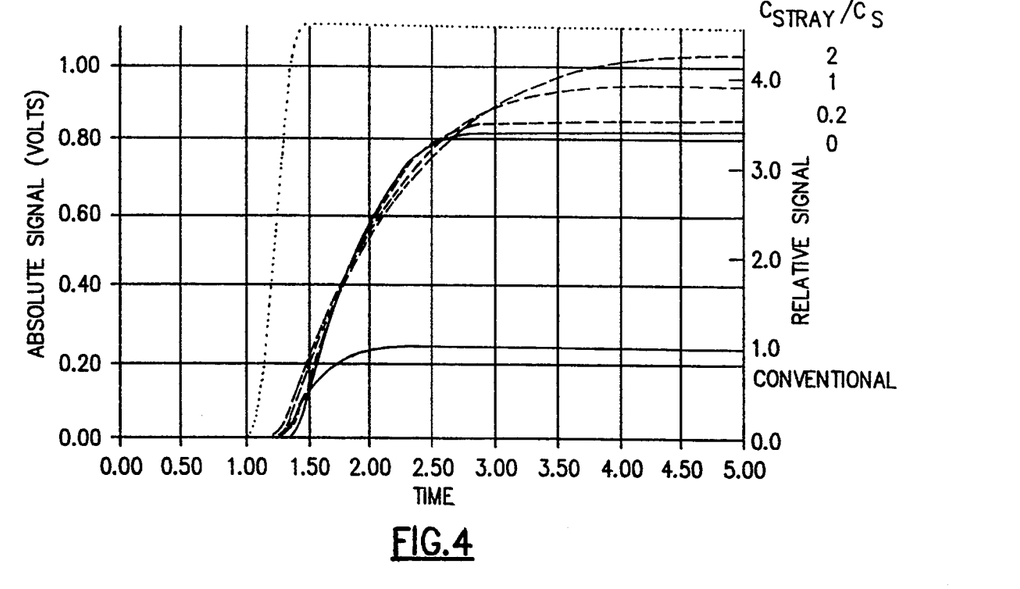
FIG. 4 is a graph showing the sensed differential signal versus time for a DRAM cell structure of the present invention.

Simulations of the sensed signal agree well with the analytical expression above. FIG. 4 shows the sense differential signal versus time for an example with a storage capacitance $C_S=40.5$ fF, a bit line capacitance $C_B=215$ fF, a high voltage $V_H=3.0$ V and a low $V_L=0$ V. The left ordinate gives the absolute signal in volts and the right ordinate shows the signal ratio relative to the conventional DRAM case. Several different cases with a $C_{STRAY}$ ranging from 0 to 2 times $C_S$ are shown. In this example, with no stray capacitance ($C_{STRAY}=0$) the sense signal for the two transistor one capacitor cell of the present invention is 3.4 times larger than the corresponding signal of the conventional one transistor cell. With the addition of $C_{STRAY}$ the relative signal is further enhanced in this case up to 4.3 for $C_{STRAY}$ equal to 2 times $C_S$.

Figure 5:
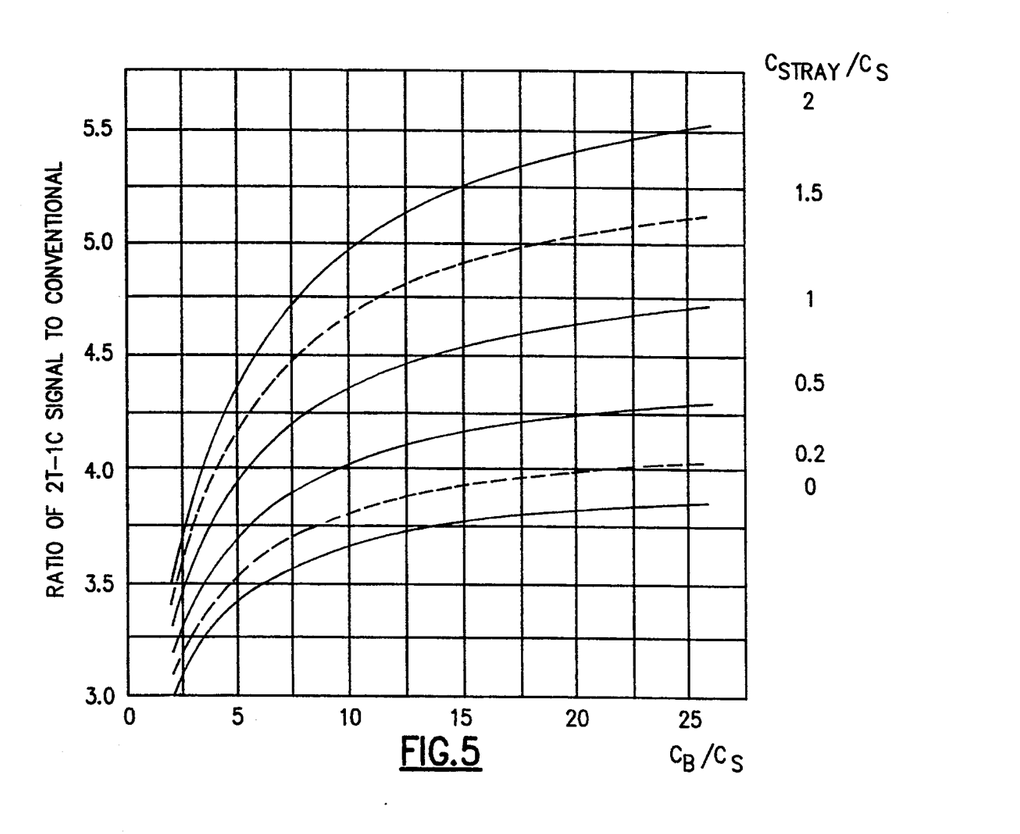
FIG. 5 is a graph showing the signal ratio as a function of capacitance of a DRAM cell of the present invention.

FIG. 5 further shows the signal advantage of the two transistor one capacitor cell of the present invention over the conventional one transistor device. In FIG. 5, the signal ratio is plotted as a function of $C_B/C_S$. As the transfer ratio decreases (larger $C_B/C_S$) the advantage of the two transistor one capacitor cell grows. Likewise, the advantage of the inclusion of $C_{STRAY}$ grows.

Figure 6:
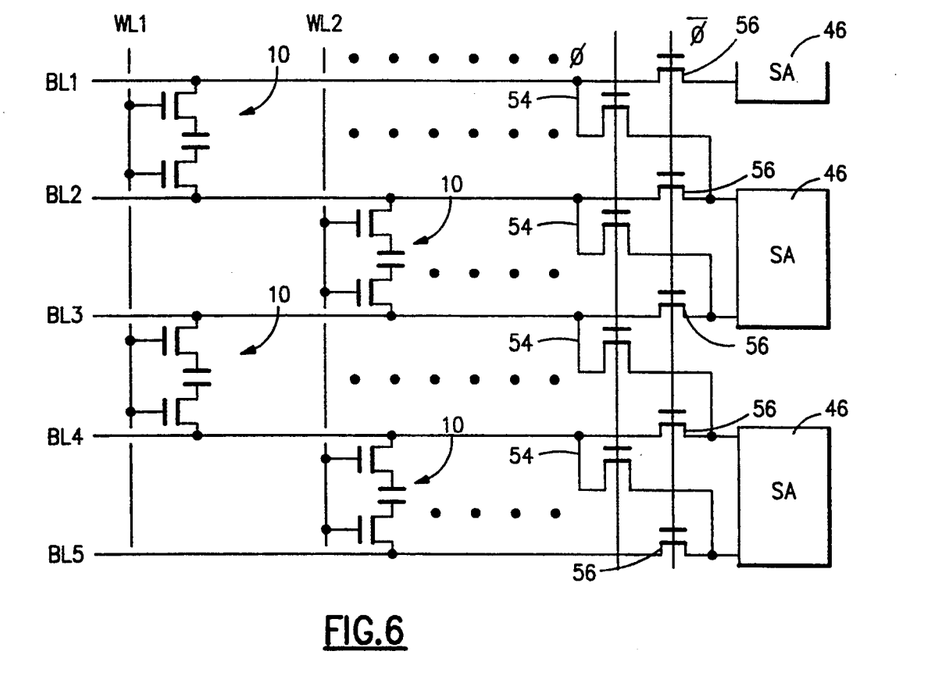
FIG. 6 is a circuit diagram of a folded bit line multiplexed DRAM structure of the present invention.
Figure 7:
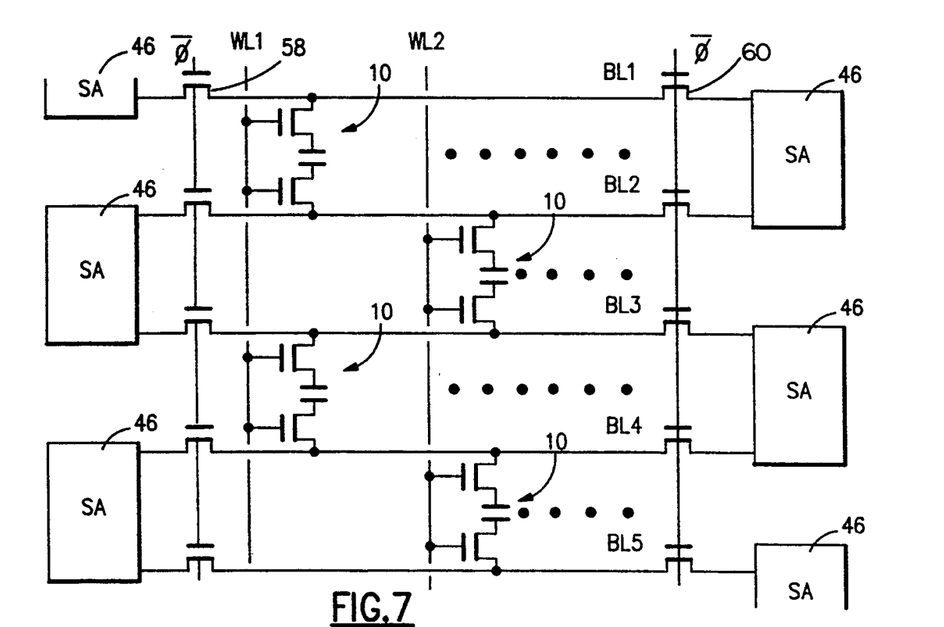
FIG. 7 is a circuit diagram of an alternate folded bit line multiplexed DRAM structure of the present invention.

The layout of the two transistor one capacitor cell of the present invention is approximately 25% larger than the idealized conventional folded one transistor cell array. This area penalty and some additional process complexity are the primary tradeoffs to achieving the 4 to 5 times larger signal for the cells of the present invention. Future technology advances such as vertical devices and silicon-on-insulator technology could diminish these penalties. One layout technique for maximizing the density of cells is to multiplex the bit lines to sense amps as shown in FIG. 6 or FIG. 7. The multiplexing scheme shown in FIG. 6 is a folded bit line scheme; FIG. 7 shows an alternate scheme employing a second set of sense amps. The scheme in FIG. 6 includes a complementary acting sets of switches 54 and 56. In FIG. 7, complementary sets of switches 58 and 60 are provided. In FIG. 6 when switches 56 are closed and switches 54 are open, the cells between bit lines BL2 and BL3, BL4 and BL5, etc. will be connected to the sense amplifiers 46. In the complementary situation when switches 54 are closed and switches 56 are open the cells between bit lines BL1 and BL2, BL3 and BL4, etc. will be connected to sense amplifiers 46. Similar complementary action occurs with switches 58 and 60 in FIG. 7. In this manner, there is no need to provide two separate bit lines for each cell but bit lines can be shared among cells.

Figure 8:
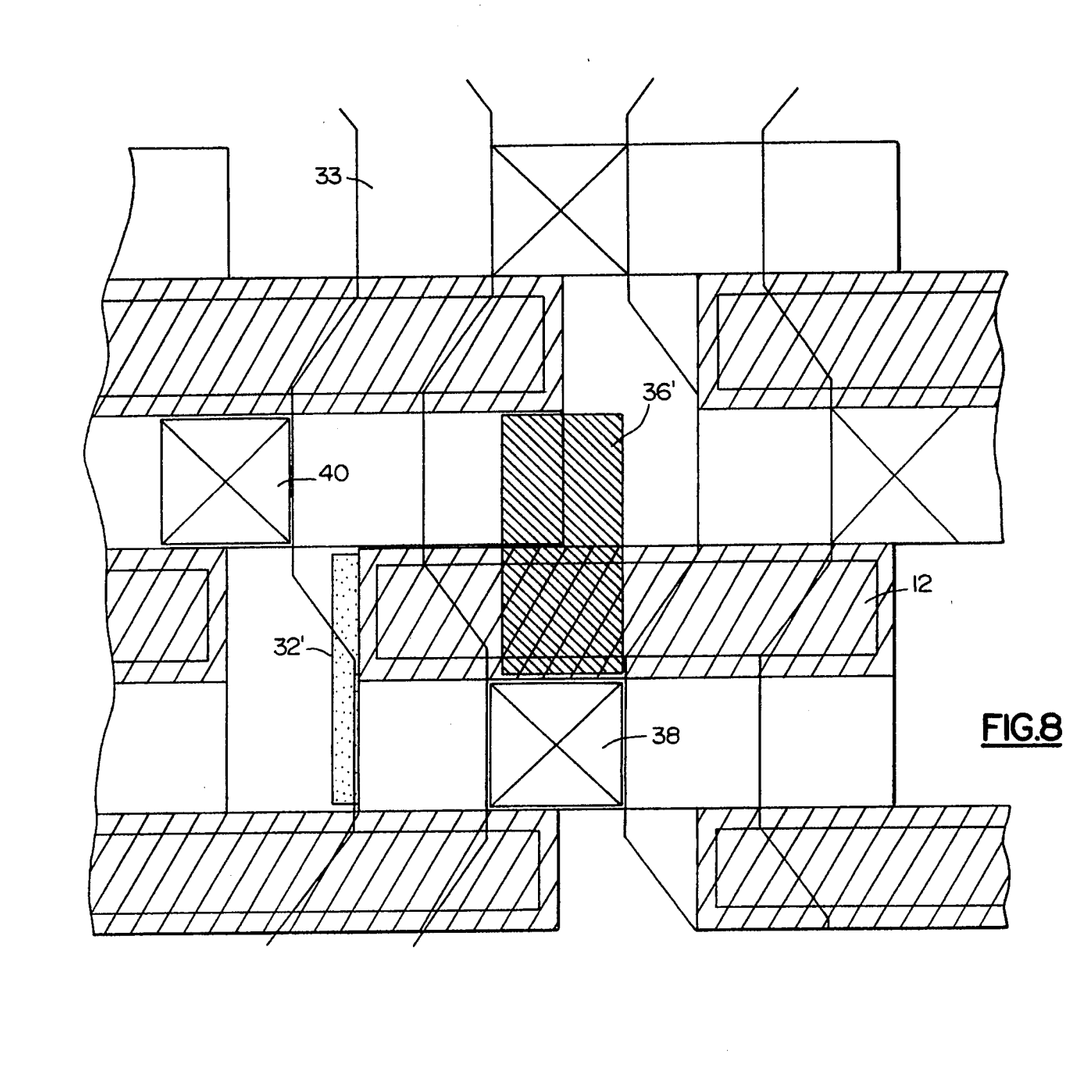
FIG. 8 is a layout diagram of one implementation of the DRAM cell structure of the present invention in a multiplexed circuit.
Figure 9:
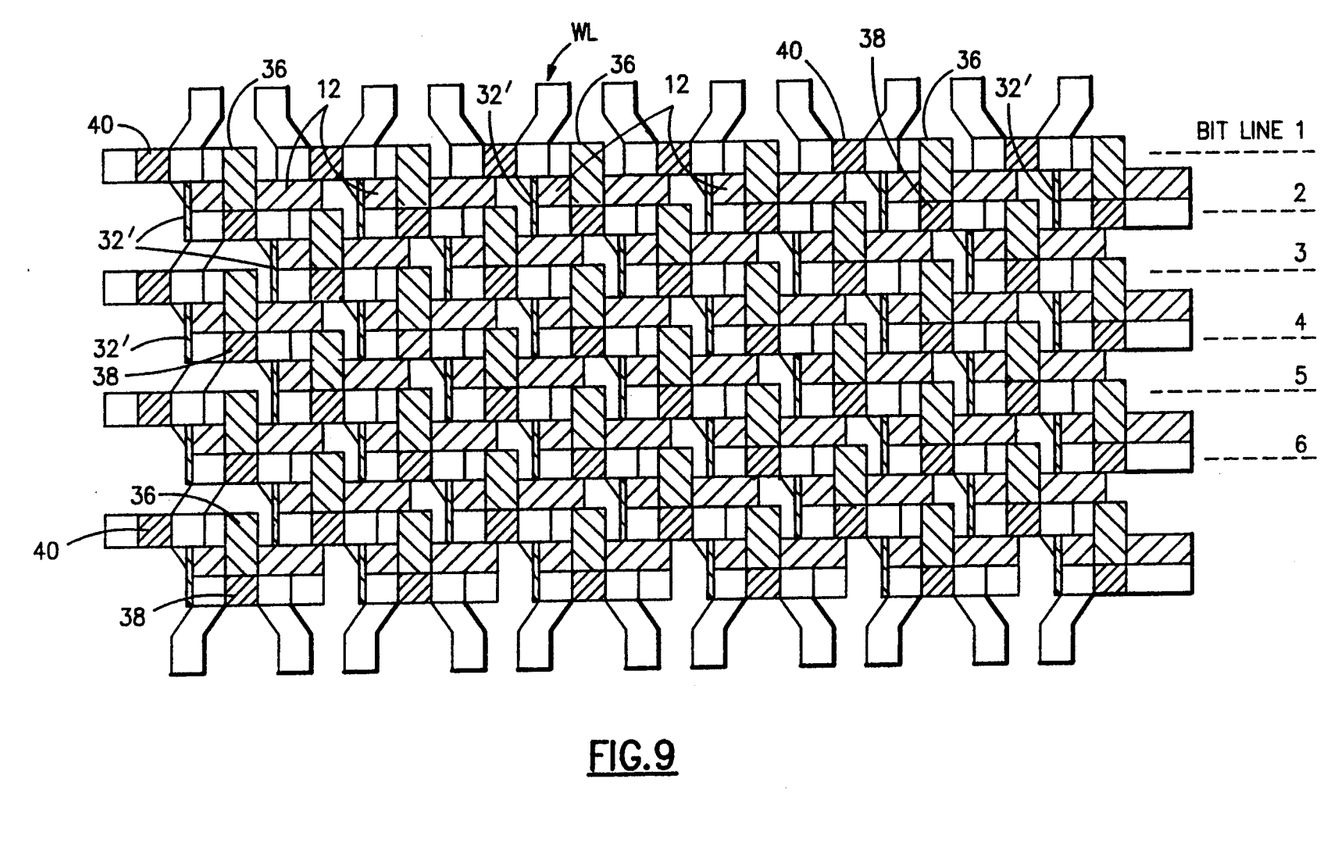
FIG. 9 is a layout view of a multiplexed array of DRAM cell structures of the present invention.

FIG. 8 is a top view of the layout of the multiplexing arrangement shown in FIG. 6 and FIG. 7 showing one cell in full and portions of surrounding cells. FIG. 9 is a top view of an array of cells as multiplexed in FIG. 6 and FIG. 7. The identical reference numerals are used to identify the features of FIG. 8 as that used in FIG. 1. The exceptions being buried strap 32' and surface strap 36' because the straps have a different shape as that shown in FIG. 1. The size and shape of the straps may vary depending on the cell layout employed. The multiplexing concept shown in FIGS. 6 and 7 is basically the same in that there is provided a plurality of bit line pairs in which each bit line can selectively be paired with two bit lines immediately adjacent thereto. As shown in the figures, there are DRAM cells connected between bit lines BL1 and BL2, between bit lines BL2 and BL3, between bit lines BL3 and BL4, between bit lines BL4 and BL5, etc. To facilitate the description of word line connections, the cells connected between bit lines BL1 and BL2, BL3 and BL4, etc., are designated the odd cells and the cells connected between bit lines BL2 and BL3, BL4 and BL5, etc. are designated the even cells. The odd cells are connected to odd numbered word lines (WL1, WL3, WL5, etc.) and the even cells are connected to the even word lines (WL2, WL4, WL6, etc.). The above multiplexing architecture allows the cell layouts to be competitive with conventional folded bit line cells.

Figure 10A:
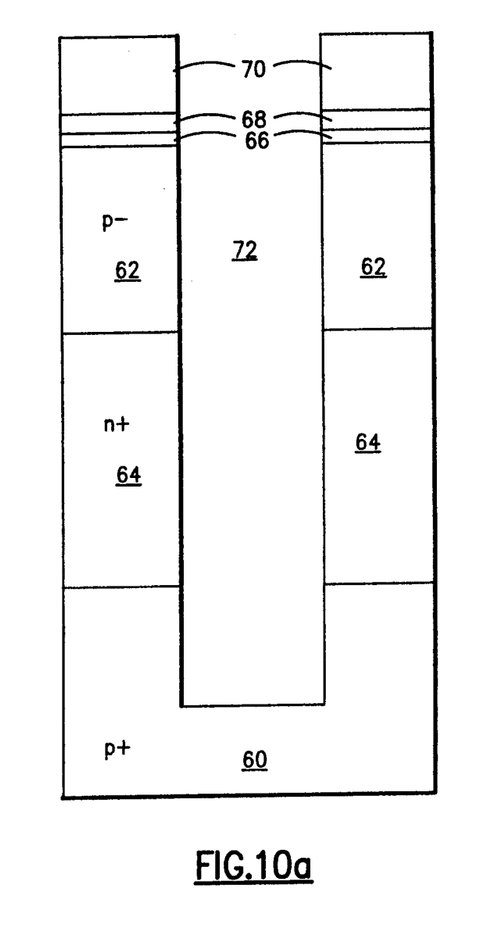
FIGS. 10(a)-10(g) show sequentially the method of fabrication of one embodiment of the DRAM cell structure of the present invention.

Turning now to the method of fabricating the two transistor one capacitor cell of the present invention, reference is made to FIGS. 10(a) through 10(g). It should be understood, however, that the method to be described hereinafter is in connection with the preferred embodiment of forming a stacked in trench capacitor with a buried strap but that the invention is in no way limited to this method. Referring now to FIG. 10(a), the first step is the formation of a deep trench in the starting wafer. Reference will be made throughout the description of the method to particular semiconductor materials such as silicon, silicon nitride, silicon oxide, etc. Moreover, particular doping types will be described but it should be clearly understood that such reference to materials and doping types are by way of example only and that other materials and doping types may also be used.

FIG. 10(a) shows a p+ substrate 60 having a p-well 62 and a buried n+ region 64. A composite layer or pad of oxide 66 and silicon nitride 68 is formed on layer 62 and a thick oxide layer 70 is formed on the composite pad. Using conventional lithographic steps, an opening in the composite and thick oxide layers is formed and the remaining oxide serves as a mask for etching a deep trench 72 using known technology.

Figure 10B:
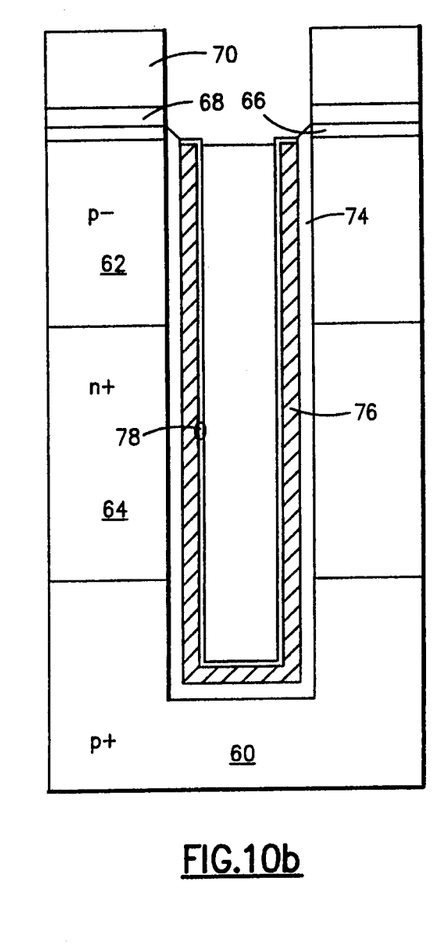

The outer electrode of the stacked in trench capacitor is formed as shown in FIGS. 10(b) by first forming a thick dielectric or oxide layer 74 along the surface of the deep trench 72. This is followed by a deposition of a thin layer of a first n+ polysilicon 76. Next, the trench 72 is filled with oxide and the oxide is etched back exposing the upper portion of the polysilicon layer 76 which is etched away thereby recessing the poly below the surface. Next, the oxide fill is removed and a thin oxide/nitride composite layer 78 is formed along the surface of the first n+ polysilicon. The composite layer 78 is a storage capacitor insulator. The layer 76 of polysilicon acts as the outer electrode of the storage capacitor, similar to the outer electrode 18 shown in the embodiment of FIGS. 2(a) and 2(c).

Figure 10C:
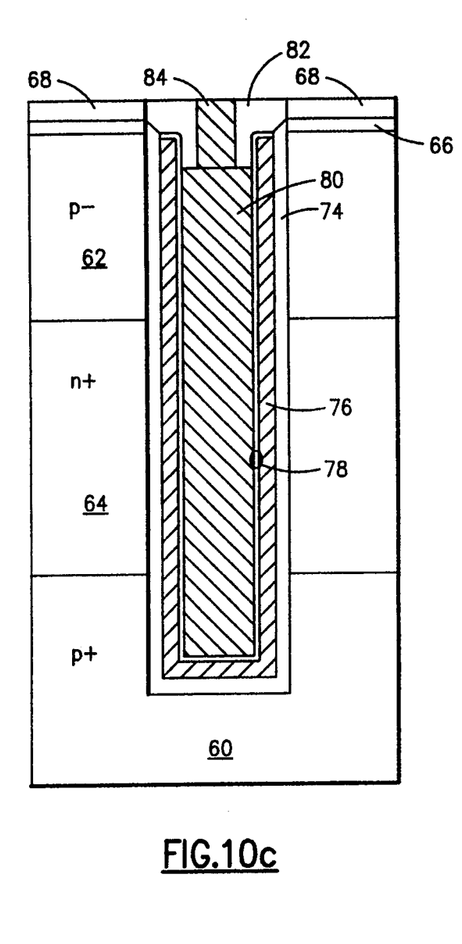

As shown in FIG. 10(c), the inner electrode of the stacked in trench capacitor is formed by first refilling the deep trench 72 with chemical vapor deposition (CVD) second n+ polysilicon or amorphous silicon 80. The n+ polysilicon 80 is recessed and the recess filled with oxide. The oxide is etched back and an oxide deep collar 82 is formed along the trench sidewall. This is followed by a refill of the n+ polysilicon and the excess poly above the trench is removed using planarization techniques. A polysilicon region 84 within oxide collar 82 provides a means for connecting the inner electrode 80 of the stacked in trench capacitor to an access transistor. The inner electrode 80 is similar to the inner electrode 16 shown in the embodiment of FIGS. 2(a) and 2(c).

Figure 10D:
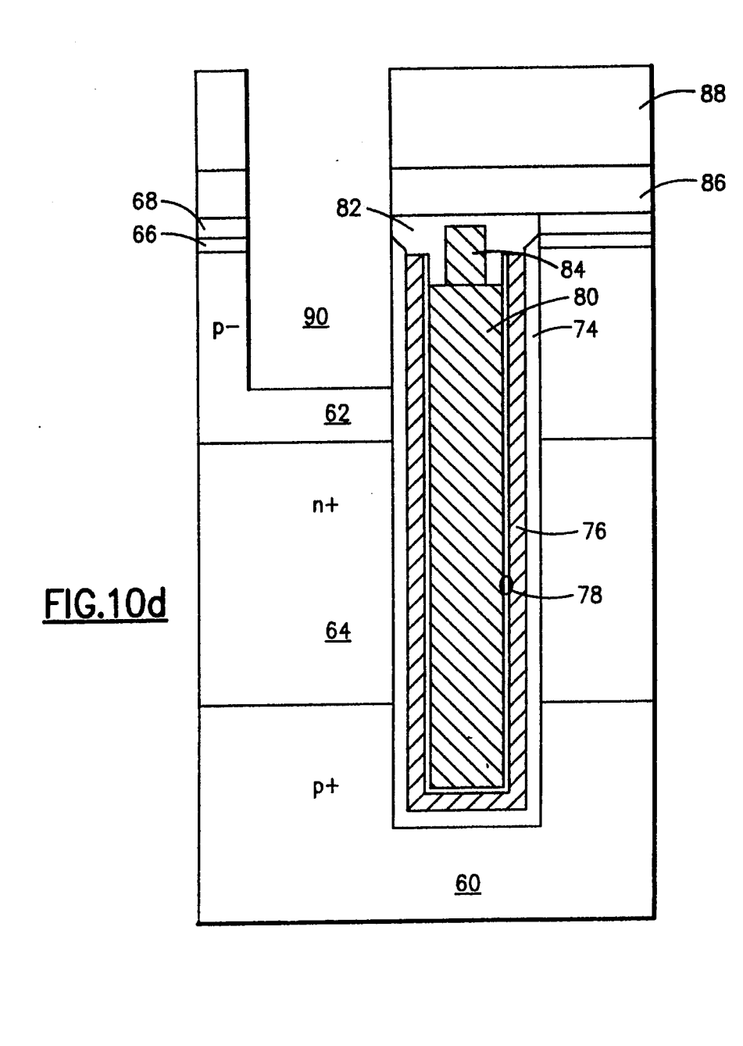
Figure 10E:
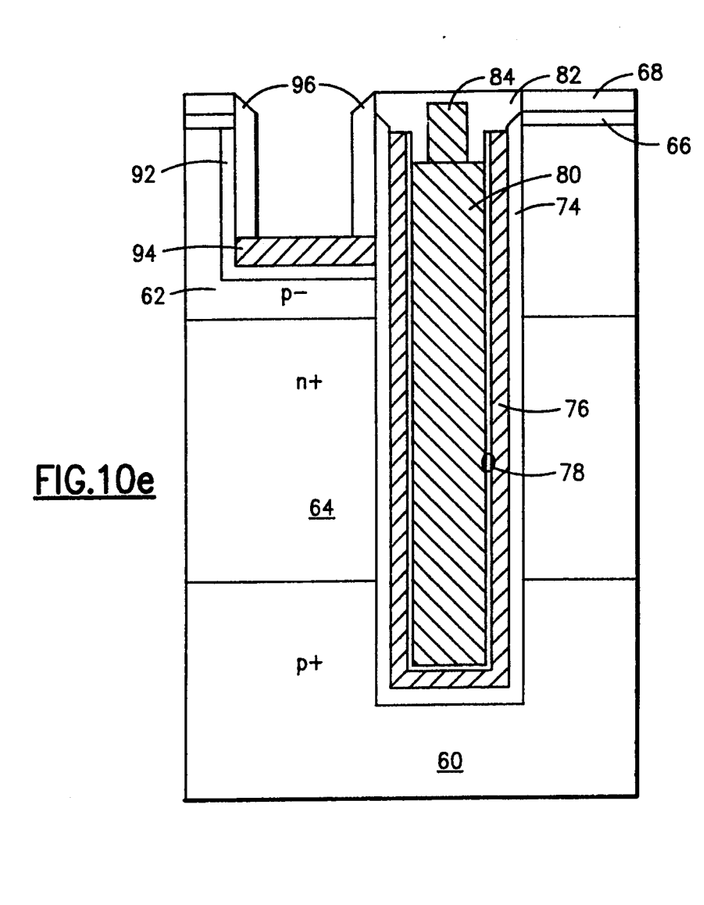
Figure 10F:
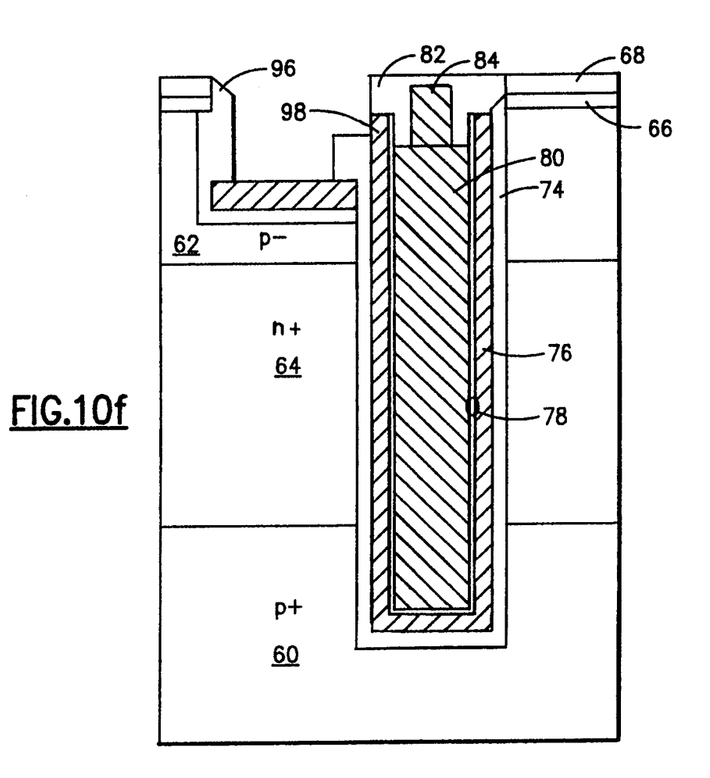

In order to fabricate the buried sidewall strap, a shallow trench is formed by first covering the wafer with a layer of low pressure chemical vapor deposition (LPCVD) nitride 86 as shown in FIG. 10(d). Using suitable masking lithography steps including the deposition of a photoresist 88, an opening is made in the LPCVD nitride and pad composite layers. The layers which remain are then used to mask the etch of a shallow trench 90 in the p-well regions by known reactive ion etching methods. A thermal oxide layer 92 as shown in FIG. 10(e) is grown on the shallow trench 90 sidewall. The shallow trench 90 is then filled with n+ polysilicon which is recessed using standard methods to form polysilicon region 94. This is followed by the formation of a spacer oxide collar 96. Next, masking and etching steps are used to remove a portion of the sidewall of a shallow trench oxide collar 96 which abuts the outer electrode 76 as shown in FIG. 10(f). This leaves portion 98 of electrode 76 exposed.

Figure 10G:
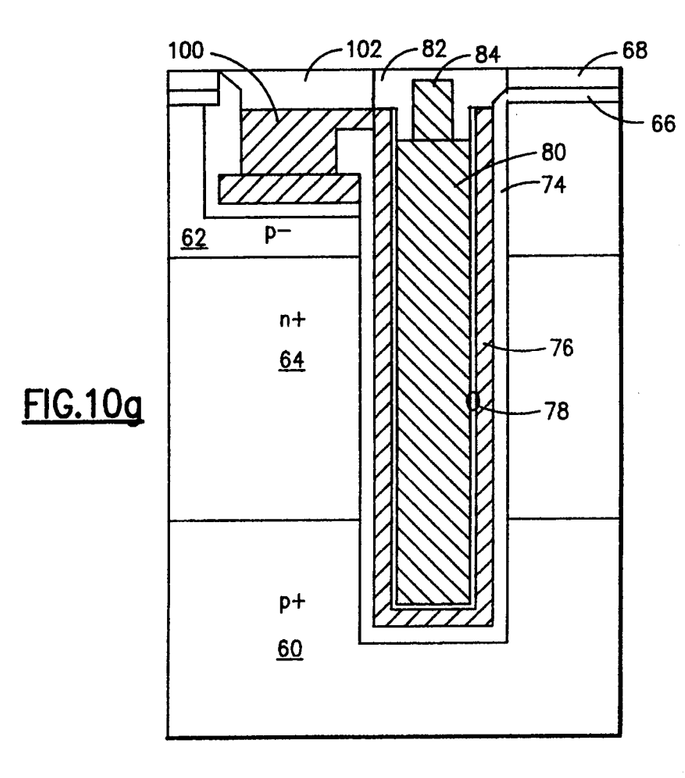

The buried sidewall strap is then formed by filling the shallow trench with chemical vapor deposition n+ polysilicon 100 and then planarizing and recessing the strap 100 as shown in FIG. 10(g). The filled shallow trench forms the buried strap interconnecting a transistor diffusion to the first n+ polysilicon electrode 76 of the capacitor. Next, a layer of silicon oxide 102 is formed on the top of the shallow trench buried strap 100. Thereafter, standard front end of line technology is used to form transistor gates, sources and drains. The surface strap interconnection shown in FIG. 2(c) between the deep trench second n+ polysilicon inner electrode and the source, drain diffusion regions of the second access transistor is formed by known means. Thereafter, known back end of line technology is applied to complete the array fabrication. The final cross-section of the two transistor one cell structure of the present invention is shown in FIGS. 2(a) through 2(c).

The major advantages of the two transistor one cell memory structure of the present invention over conventional folded bit line DRAM cells are the significantly larger sense signal which is four to five times larger, the avoidance of dummy cells, and the identical word line coupling to a bit line and its complement. The signal advantage may be used in several ways, such as, reducing the power supply voltage for low power designs, eliminating word line boosting, reducing storage cell capacitance and increasing bit line length (increasing the number of bits per bit line). The increased signal to noise ratio can be used to avoid twisting of bit lines or to allow higher speed designs. Two transistor one capacitor cells of the present invention may best be suited for special applications such as those requiring largest obtainable signal levels, for example, low-power or high-speed memories.

While the invention has been particularly shown and described with respect to preferred embodiments thereof, it will be understood by those skilled in the art that the foregoing and other changes in form and details may be made therein without departing from the spirit and scope of the invention.

Having thus described the invention, what we claim as new and desire to secure by Letters Patent is:

1. A dynamic random access memory device having a plurality of memory cells comprising:
   a semiconductor substrate;
   an array of a plurality of bit lines and word lines formed on said substrate;
   a plurality of storage capacitors each having a pair of electrodes formed within a trench in said semiconductor substrate, the electrodes of each capacitor being isolated from the electrode of every other capacitor of said plurality of capacitors; and
   a pair of access field effect transistors for each storage capacitor, each transistor being formed in said substrate and having source, drain and gate regions, one of said source and drain regions of each transistor being connected to a different bit line of a bit line pair and the other of said source and drain regions of each transistor being connected to a different electrode of the respective storage capacitor, the gates of both transistors being connected to a single word line;
   each storage capacitor and corresponding pair of access field effect transistors forming a memory cell of said device.

2. The dynamic random access memory device of claim 1 wherein
   said bit lines and word lines are formed in a matrix of N bit lines and M word lines arranged in columns and rows on said substrate, said plurality of bit lines in said matrix including a first bit line, an Nth bit line and N-2 intermediate bit lines,
   each of said intermediate bit lines being connected to at least two access field effect transistors, each of said at least two access transistors being from a memory cell connected between a different bit line pair.

3. The dynamic random access memory device of claim 2 further including a plurality of sense amplifiers, each of said n bit lines including a pair of complementary acting switches for selectively connecting each bit line to one of two sense amplifier inputs.

4. The dynamic random access memory device of claim 2 wherein said bit lines, word lines, memory cells and sense amplifiers are arranged in a folded bit line architecture.

5. The random access memory device of claim 1 wherein said storage capacitor is a stacked in trench capacitor.

6. A two transistor, one capacitor, dynamic random access memory cell comprising:
   a semiconductor substrate of a first conductivity type;
   a first trench formed in said substrate, said trench having opposed sidewalls;
   a first insulating layer formed on said opposed sidewalls of said trench;
   a first conductive layer of a second conductivity type formed on said first insulating layer;
   a second insulating layer formed on said first conductive layer;
   a second conductive layer of said second conductivity type filling said trench;
   said first and second conductive layers and said second insulating layer forming a storage capacitor;
   a first field effect transistor formed in said semiconductor substrate, said transistor having source, drain and gate regions and means for connecting one of the source or drain regions to said first conductive layer; and
   a second field effect transistor formed in said semiconductor substrate, said transistor having source, drain and gate regions and means for connecting one of the source or drain regions to said second conductive layer.

7. The memory cell of claim 6 wherein said means for connecting the source or drain regions of said first field effect transistor includes a conductive buried sidewall strap layer.

8. The memory cell of claim 7 wherein said means for connecting the source or drain regions of said second field effect transistor includes a conductive surface strap layer.

9. The memory cell of claim 7 wherein said conductive sidewall strap layer includes a second trench formed in said substrate adjacent said first trench, a third insulating layer formed on the sidewalls and bottom wall of said second trench, and a third conductive layer filling said second trench and contacting said first conductive layer through an opening in said third insulating layer.

10. The memory cell of claim 8 wherein said conductive surface strap layer includes an insulating collar surrounding an upper portion of said second conductive layer and a fourth conductive layer on the surface of said substrate contacting said upper portion and a source/drain diffusion region of said second transistor formed in the surface of said substrate.

11. The memory cell of claim 9 wherein said third conductive layer contacts a source/drain diffusion region of said first transistor formed in the surface of said substrate.

12. The dynamic random access memory device of claim 1 wherein each of said plurality of memory cells comprise the memory cell of claim 6.

13. The memory cell of claim 6 wherein said first and second conductive layers are formed on one of polysilicon or amorphous silicon.

14. The memory cell of claim 13 wherein said first insulating layer is oxide and said second insulating layer is a composite nitride/oxide.

15. The memory cell of claim 8 wherein said sidewall strap and said surface strap are formed of polysilicon.

16. A dynamic random access memory device comprising:
   a plurality of the memory cells of claim 6;
   a plurality of bit lines and word lines formed on said substrate in an array;
   the other of said source or drain regions of said first and second transistors being connected to a complementary pair of bit lines and the gates of both said first and second transistors being connected to a single word line.

17. The dynamic random access memory device of claim 16 wherein
   said bit lines and word lines are formed in a matrix of N bit lines and M word lines arranged in columns and rows on said substrate, said plurality of bit lines in said matrix including a first bit line, an Nth bit line and N-2 intermediate bit lines,
   each of said intermediate bit lines being connected to at least two access field effect transistors, each of said at least two access transistors being from a memory cell connected between a different bit line pair.

18. The dynamic random access memory device of claim 17 further including a plurality of sense amplifiers, each of said n bit lines including a pair of complementary acting switches for selectively connecting each bit line to one of two sense amplifier inputs.

19. The dynamic random access memory device of claim 17 wherein said bit lines, word lines, memory cells and sense amplifiers are arranged in a folded bit line architecture.

* * * * *